Aug. 5, 1969 A. W. RZANT 3,459,918

WELDING OF ELECTRICAL ELEMENTS HAVING VOLTAGE SENSITIVE COMPONENTS

Filed Jan. 13, 1967

INVENTOR
ADOLPH W. RZANT

BY Robert W. Ely

ATTORNEY

United States Patent Office 3,459,918

Patented Aug. 5, 1969

3,459,918
WELDING OF ELECTRICAL ELEMENTS HAVING VOLTAGE SENSITIVE COMPONENTS

Adolph W. Rzant, Poughkeepsie, N.Y., assignor to International Business Machines Corporation, Armonk, N.Y., a corporation of New York Filed Jan. 13, 1967, Ser. No. 609,081
Int. Cl. B23k *35/06, 11/10*
U.S. Cl. 219—91 7 Claims

ABSTRACT OF THE DISCLOSURE

In the resistance welding of the connector strips of an integrated circuit module or chip to the strip terminals of the substrate which supports the chip, the possibility of back voltage damage to a voltage sensitive element when welding is avoided by arranging the positive and negative welding electrodes on a line which is perpendicular to the lengthwise axis of the overlaying connector strip of the module to the strip terminal of the substrate.

This invention relates to connecting electrical elements by bonding and more particularly concerns the welding or bonding of projecting leads or terminals from very small modules or flat packs containing semiconductor or integrated circuit chips to the small printed circuit lines or terminal lands on the substrate which supports the chip.

Integrated circuit modules have voltage sensitive components, such as transistors or diodes, in parallel or series. The modules also have a plurality of projecting leads which are welded to printed circuit lines of a supporting substrate or leads of other modules. In the past, the use of standard welding voltage potentials, such as found in parallel or series resistance welding electrodes along the major or lengthwise axis places back voltage pulses along the major axis and hence damage to the voltage sensitive diodes and the like and also to certain components connected to the printed circuits, when the module connections complete low impedance parallel or series loops through the modules and the printed circuit lines of the substate or board. Usually, it was impractical to anticipate and difficult to detect; and, even so, cause a high loss of modules. The back voltages (parallel or serially cross-linked) have been as high as 4–10 volts from the welding power supply to provide sufficient current flow for welding or resistance heating. The resulting current flow exceeds the tolerances for diodes or the like.

An object of the present invention is to avoid the above disadvantages and to provide a new improved welding or bonding method for very small connections between supporting structure connectors and leads from integrated circuit parts.

Another object is to provide DC or AC welding power source arrangement wherein the electrodes are perpendicular to the major (lengthwise) axis of strip connections.

In accordance with the disclosed embodiment of the invention, a short strip lead from an integrated circuit module is aligned with an overlaps substrate strip lead. The module has a diode in a circuit which includes both strip leads. On a DC power source, the plus and minus electrodes are placed close together on a line which is essentially perpendicular to the major axis of the thin, small strip leads or connectors. Then, a DC pulse effects a resistance weld without excessive welding current due to back voltage which causes damage to the diode or the like.

The realization of the above objects, along with the features and advantages of the invention, will be apparent from the following description and drawing in which.

Figures 1, 2, 3, 4:
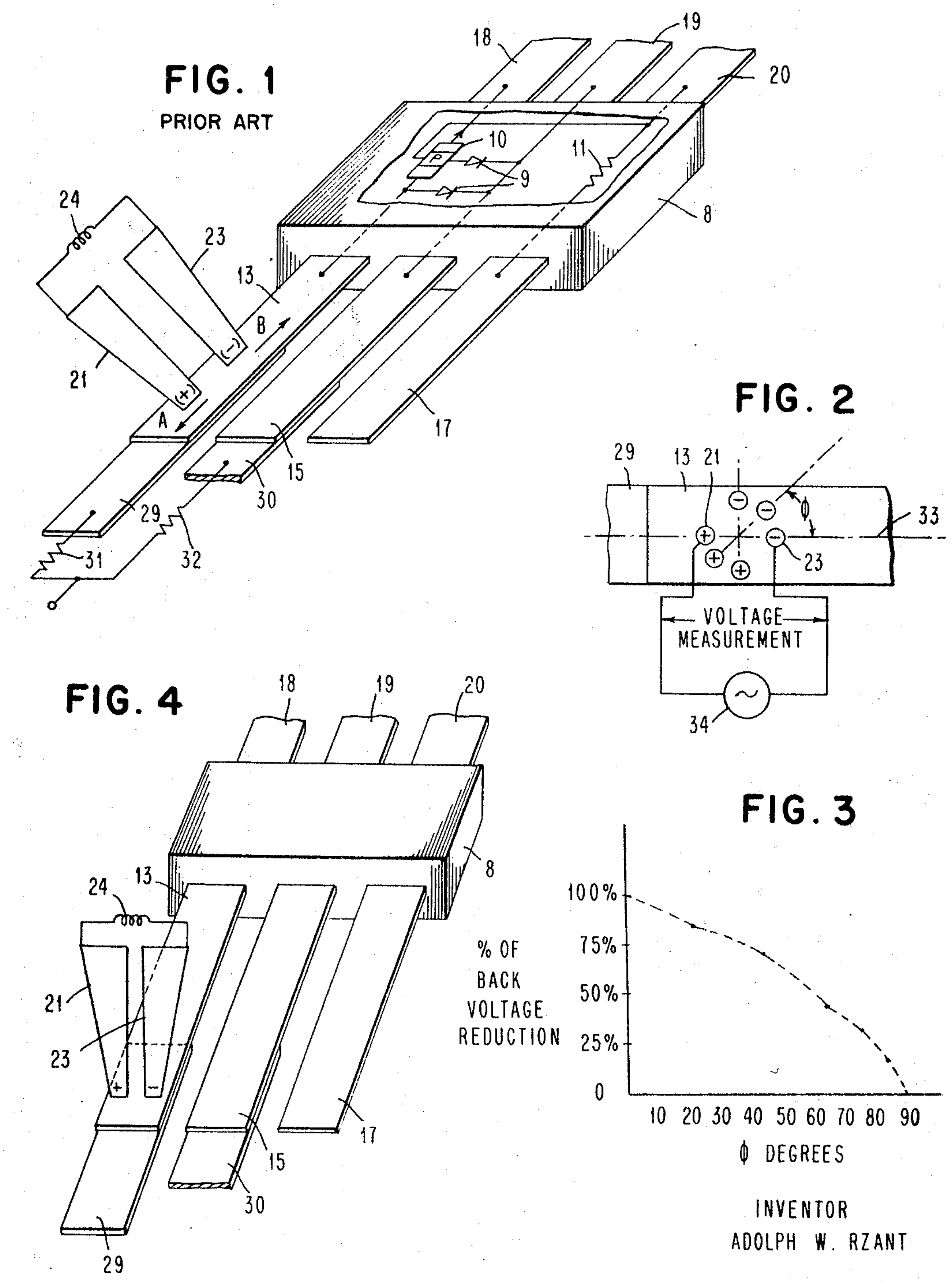
FIG. 1 PRIOR ART, FIG. 2, FIG. 3, FIG. 4
FIG. 1 is a perspective view of the prior method of welding.
FIG. 2 is a diagram showing the back voltage effect as the electrodes are rotated 90 degrees; relative to the lengthwise axis.
FIG. 3 is a chart showing the percentage drop in back voltage (Y coordinate) as a function of the $\phi$ angle (X coordinate)
FIG. 4 is a perspective view and shows the perpendicularly aligned electrodes which avoid excessive current flow to the module.

In FIG. 1, the prior method of welding is shown. In this method, there is the aforementioned problem of a back voltage hazard to the sensitive parts of integrated circuit modules 8 and similar devices. The integrated circuit module 8 is very small and arranged with very fine-line connected diodes 9, transistor 10 and resistor 11. Many such elements are highly sensitive to voltages in the welding range, regardless of the circuit which often includes resistors. Each integrated circuit module (ICM) is shown with three bottom terminals or leads 13, 15, 17 and three top leads 18, 19, 20 by way of example. It being understood that many more leads, at the top, bottom and sides, could exist. Typically, each lead is 0.006″ thick and 0.040″ wide. Only two line or strip connectors 29, 30 from a module-supporting substrate or printed circuit card or the like are exemplarily shown. These are connected through resistors 31, 32. It is understood that each ICM lead has or will have a corresponding connector for each lead top and bottom. The spacing 0.010″ between terminals is very small. The connectors or terminals 30, 31 overlapped the leads for a range of about 0.10″.

In order to make the necessary electrical connection, a DC welding circuit or similar heat generating circuit, is established and has an outer and inner electrode 21 and 23 which have a cross section of 225 x $10^{-6}$ square inches. The space between the adjacent sides of the electrodes is 0.005″. The positive electrode 21 and negative electrode 23 are connected at their non-contact ends to a conventional DC source of direct current 24 to give a voltage of 4–10 volts, and amperage of 100–400 during a time period of 2 to 10 milliseconds.

In such a resistance welding circuit or any like electrical energy dissipating system, there is a serious hazard of impressing a voltage causing partial welding current flow across the circuit elements larger than the sensitive semiconductor or ICM can withstand. The most common mode of connection by welding of unit logic devices, integrated circuit modules or packages, or discrete components is to probe along the major (lengthwise) axis along one lead as shown in FIG. 1. This means that as more and more terminations or connections are made, the probability is greater that the impressed voltage of the welding system will appear across a circuit element which will not be capable of handling the current flow at this very high voltage and cause blow-out or undetectable damage.

In FIG. 1, the welding system voltage will appear across any active element 9, 10 (or passive 11) that might be connected to electrode contact points as additional connections are made. The letters A and B with arrows in opposite directions adjacent plus electrode 21 and minus electrode 23 respectively, indicate the current hazard due to back voltage.

In FIG. 2 the voltage change is schematically shown, the DC voltage source 24 of FIG. 1 is connected to plus electrode 21 and minus electrode 23 with the dashed line indicating the center line or major axis 33 passing through the midpoint of electrodes 21, 23. The voltage output was monitored at 34 by oscilloscope. Within fixed angles $\phi$ of rotation for the two electrodes, a working range can be found for the necessary degree of back voltage reduction for an ICM, a current sensitive semiconductor or other device can be determined. The optimum geometry for back voltage reduction across the system is when the electrodes are at right angles to the main or lengthwise axis of the strip conductors. FIG. 4 shows this optimum condition. The feasible working range of angles for $\phi$ is 80 to 100 degrees which for the 25% plus or minus fraction is substantially perpendicular.

FIG. 3 shows a chart with a drop off of voltage (X coordinate) as the $\phi$ degrees (Y coordinate) increases to the optimum of 90 degrees. It is believed to be self-explanatory with reference to the other figures and description.

FIG. 4 shows the invention which was developed to overcome or cause elimination of back voltage hazards in ICM or semiconductor welding. The invention optimumly solves the problem by having the electrodes 21 and 23 which are at right angles to the strip conductor lengthwise or major axis. They are separated by a gap of 0.005". With this arrangement, the most voltage-sensitive ICM-substrate arrangements or other computer electronic devices can be welded.

It is apparent that the leads of two modules can be connected, that AC welding can be used and that the energy source can be used for resistance heating in solder or braze bonding, as well as the described weld bonding. For example, solder reflow, solder strip, braze strip or solder or braze coatings will provide bondable activated by heat to provide a bond without a back voltage problem.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. The method of welding electronic devices having voltage sensitive elements comprised of:

providing a device having a lead extending a short length, providing a strip connector having a short length, said strip connector and said lead being part of electrical circuit means including a voltage-sensitive element, overlaying said lead and said connector, contacting the lead or connector with a plus and a minus electrode of a resistance welding circuit so that the current between electrodes will be laterally across the lead or connector and localized, and passing DC current through said electrodes to weld said lead and connector without back voltage damage to said voltage-sensitive element.

2. The method according to claim 1 and being further characterized by:

said device being an integrated circuit module and being part of said circuit means, said element being part of said module, said lead overlaying said connector so that said electrodes contact said lead, and said electrodes being aligned essentially perpendicularly to the lengthwise axis of said lead and connector.

3. The method of welding electronic devices having voltage-sensitive elements comprised of:

providing a semi-conductor module having a flat lead extending a short length, providing a strip connector having a short length on a support structure, said strip connector, said connector and said module being part of electrical circuit means including a voltage-sensitive element in said module, overlaying said flat lead on said strip connector, contacting the lead with a plus and a minus electrode of a resistance welding circuit so that the electrodes are spaced closely and the current between electrodes will be perpendicular to the lengthwise axis of said lead, and passing DC current through said electrodes to weld said lead and connector with localized current flow and without welding current flow to said voltage-sensitive device.

4. The method of welding electronic devices having voltage sensitive elements comprised of:

providing a module having a flat lead extending a short length, providing a strip connector having a short length, said module having an element which will be harmed if subject to the welding current necessary for welding said flat lead and said strip connector, said lead, said connector, and said element being connected by circuit means, overlaying said lead and said connector so that a major axis is along the lengths of the lead and connector, contacting the lead or connector with a plus and minus electrode of a resistance welding circuit on a line aligned perpendicular to said major axis, and passing DC welding current to said electrodes to weld said lead and connector without back voltage damage to voltage sensitive elements.

5. The method of welding electronic devices having voltage sensitive elements comprised of:

providing an integrated circuit module having a flat lead extending a short length, providing a strip connector having a short length on a support structure, said module having an element which will be harmed if subject to the welding current necessary for welding said flat lead and said strip connector, said lead, said connector, and said element being connected by circuit means including at least another such lead and another such connector which have been bonded, overlaying said flat lead on said strip connector so that a major axis is along the lengths of the lead and connector, contacting the flat lead with a plus and minus spring-biased electrode of a resistance welding circuit on a line aligned perpendicular to said major axis, and passing DC welding current locally between said electrodes to weld said lead and connector without welding current flow to voltage sensitive elements.

6. The method of welding electronic devices having voltage sensitive elements comprised of:

providing a device having a lead extending a short length, providing a strip connector having a short length, said strip connector and said lead being part of electrical circuit means including a voltage-sensitive element, overlaying said lead and said connector, contacting the lead or connector electrodes of a resistance welding circuit so that the current flow between electrodes will be laterally across the lead or connector and localized, and passing current through said electrodes to weld said lead and connector without back voltage damage to said voltage-sensitive element.

7. The method of bonding electronic devices having voltage sensitive elements comprised of:

providing a device having a lead extending a short length, providing a strip connector having a short length, said strip connector and said lead being part of electrical circuit means including a voltage-sensitive element, overlaying said lead and said connector, said lead and said strip having heat-actuatable bondable means, contacting the lead or connector with electrodes of a resistance heating circuit so that the current between electrodes will be laterally across the lead or connector and thus localized, said electrodes being substantially perpendicular to the lengthwise axis of said lead and connector, and passing current through said electrodes to bond said lead and connector without back voltage damage to said voltage-sensitive element.

References Cited

UNITED STATES PATENTS

| | | | |
|---|---|---|---|
| 2,137,909 | 11/1938 | Hagedon ------------ | 219—91 |
| 3,274,667 | 9/1966 | Siebertz ------------- | 29—589 |

JOSEPH V. TRUHE, Primary Examiner

L. ROUSE, Assistant Examiner